(12) United States Patent
Vanevenhoven et al.

(10) Patent No.: US 12,099,096 B2
(45) Date of Patent: Sep. 24, 2024

(54) BUILT IN TEST (BIT) FOR TRANSFORMER RECTIFIER UNIT (TRU) BACKFEED INTERLOCK

(71) Applicant: Hamilton Sundstrand Corporation, Charlotte, NC (US)

(72) Inventors: Jordan K. Vanevenhoven, Rockford, IL (US); Jeffrey D. Myroth, Roscoe, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 300 days.

(21) Appl. No.: 17/665,867

(22) Filed: Feb. 7, 2022

(65) Prior Publication Data

US 2023/0251329 A1 Aug. 10, 2023

(51) Int. Cl.
*G01R 31/62* (2020.01)
*B64D 41/00* (2006.01)
*H02J 3/02* (2006.01)

(52) U.S. Cl.
CPC .............. *G01R 31/62* (2020.01); *H02J 3/02* (2013.01); *B64D 41/007* (2013.01); *B64D 2221/00* (2013.01); *H02J 2310/44* (2020.01)

(58) Field of Classification Search
CPC ........ G01R 31/62; H02J 3/02; H02J 2310/44; H02J 4/00; H02J 7/0044; H02J 3/381; H02J 2310/23; H02J 3/0073; H02J 1/12; H02J 13/00017; H02J 1/102; H02J 50/12; H02J 50/40; H02J 50/70; H02J 15/00; H02J 3/01; H02J 3/32; H02J 7/007186; H02J 7/007192; H02J 7/02; H02J 7/06; H02J 7/14; B64D 41/007; B64D 2221/00; B64D 324/547; B64D 45/02; B64D 45/0005; B64D 2027/026; B64D 27/24; B64D 31/06; B64D 31/14; B64D 47/00; (Continued)

(56) References Cited

U.S. PATENT DOCUMENTS 4,785,453 A 11/1988 Chandran et al.
6,825,578 B2 11/2004 Perttu
(Continued)

FOREIGN PATENT DOCUMENTS

EP 2797194 A1 * 10/2014 ............. H02H 7/125
EP 3883085 A1 9/2021
EP 3883104 A1 9/2021

OTHER PUBLICATIONS

"Short Form Catalog", Corporation Leach International, Sep. 30, 2019, pp. 1-20.
(Continued)

*Primary Examiner* — Eman A Alkafawi
*Assistant Examiner* — Courtney G McDonnough

(57) ABSTRACT

A method includes performing a test for transformer rectifier unit (TRU) backfeed protection by removing AC power supplied to the TRU but keeping the TRU contactor closed for a first predetermined span of time. The method includes observing the TRU for a second predetermined span of time. The method includes determining if the contactor opens during the second span of time, that a TRU backfeed protection is functional and passes the test, and determining if the contactor does not open during the second span of time, that the TRU backfeed protection has failed the test.

17 Claims, 3 Drawing Sheets

(58) Field of Classification Search
CPC ...... H02M 3/33592; H02M 1/08; H02M 1/12; H02M 3/33507; H02M 7/08; H02M 1/32; H02M 1/0032; H02M 1/4216; H02M 1/0054; H02M 1/14; H02M 3/07; H02M 3/33523; H02M 1/0009; H02M 1/0048; H02M 1/009; H02M 1/143; H02M 1/4225; H02M 3/285; H02M 3/335; H02M 3/3376; H02M 7/06; H02M 1/0058; H02M 1/36; H02M 3/33546; H02M 5/27; H02M 1/0012; H02M 1/0025; H02M 1/0045; H02M 1/007; H02M 1/10; H02M 1/327; H02M 1/342; H02M 1/4241; H02M 1/4258; H02M 1/44; H02M 3/003; H02M 3/073; H02M 3/157; H02M 3/158; H02M 3/28; H02M 3/33515; H02M 3/33538; H02M 3/33569; H02M 3/33576; H02M 7/003; H02M 7/04; H02M 7/5387; H02M 1/00; H02M 3/00; H02M 5/00; H02M 7/00; H02M 11/00; H01H 47/001; H01H 9/54; H01H 9/56

USPC ........................................................ 324/547
See application file for complete search history.

(56) References Cited

U.S. PATENT DOCUMENTS

| 7,446,437 | B2 | 11/2008 | Paik et al. |
| 7,599,161 | B2 | 10/2009 | Premerlani et al. |
| 10,809,789 | B1 | 10/2020 | Lambert et al. |
| 2021/0288488 | A1* | 9/2021 | Seagren ................ H02M 7/068 |

OTHER PUBLICATIONS

Extended European Search Report dated Jul. 26, 2023, issued during the prosecution of European Patent Application No. EP 23154553.4.

* cited by examiner

BUILT IN TEST (BIT) FOR TRANSFORMER RECTIFIER UNIT (TRU) BACKFEED INTERLOCK

BACKGROUND

1. Field

The present disclosure relates to power supply and distribution, and more particularly to power supply and distribution such as in aircraft.

2. Description of Related Art

In traditional aircraft electrical power systems, a DC essential bus is able to be fed from a primary or normal power source such as a Transformer Rectifier Unit (TRU), potentially via a DC bus, and also fed from an alternate or emergency power source such as an essential TRU, which would be powered by a Ram Air Turbine (RAT) in an electrical emergency. When a TRU is powered, primary system contactors are closed to power the respective DC essential bus. When the TRU is not powered, the same primary system contactors are opened, and an alternate system contactor is closed to power the DC essential bus from an alternate source. One of the primary system contactors is opened to prevent a DC bus load from overloading the alternate power source.

To ensure independence between the primary and alternate systems, some applications use an AC relay and interlock which would open the primary system contactors if TRU input power is lost to ensure proper load shed. Here, when the AC input power to the TRU is lost, the relay would open the first primary system contactor coil return, forcing the contactor open regardless of the contactor driver command. The second primary system contactor may be opened directly by this or via interlock with first primary system contactor.

However, there may not be sufficient room in the AC system for an AC relay, and simply placing a DC relay downstream of the TRU will not provide equivalent function if the TRU were to backfeed from some other source such as a battery after the AC input power is lost.

Newer schemes may be able to function without the use of an AC relay, but it is not as simple to test its functionality as the AC relay-based implementation. In safety critical systems, a dormancy of this function may not be acceptable.

For an AC relay based implementation, the function could be simply tested by attempting to close the TRU contactor when there is no AC power input (for example, an easy time to do this would be during a power up test on ground in a battery only configuration).

The conventional techniques have been considered satisfactory for their intended purpose. However, there is an ever present need for improved systems and methods for TRU backfeed interlock testing. For the TRU backfeed protection and interlock scheme, it is not as simple as AC relay based implementation, since pending circuit level implementation, some failures in the backfeed sense electronics may allow the backfeed indication to remain active when the electronics are unpowered (and not backfed) versus if they were backfed. A method is needed to backfeed the TRU while the LRU is installed in the system to test the functionality of the TRU backfeed protection interlock. This disclosure provides a solution for this need.

SUMMARY

A method includes performing a test for transformer rectifier unit (TRU) backfeed protection by removing AC power supplied to the TRU but keeping the TRU contactor closed for a first predetermined span of time. The method includes observing the TRU for a second predetermined span of time. The method includes determining if the contactor opens during the second span of time, that a TRU backfeed protection is functional and passes the test, and determining if the contactor does not open during the second span of time, that the TRU backfeed protection has failed the test.

The method can include removing TRU contactor command to end the test. The method can further include communicating whether the TRU contactor controller passed or failed. Removing AC power supplied to the TRU can be performed as part of a normal cycle of the power system of an aircraft in which the TRU is located. The method can include confirming a transformer rectifier unit (TRU) aboard an aircraft is not in flight to ensure the test is not performed in flight. This can include receiving input including weight on wheels, airspeed, external power supplied to the aircraft, and/or status of an auxiliary power unit (APU) aboard the aircraft to confirm whether the TRU is in flight.

Keeping the TRU contactor closed for a first predetermined span of time can include keeping one or more DC contactors in series with the TRU contactor commanded closed during the first predetermined span of time. The method can include backfeeding the TRU with power from a battery connected to the TRU through the one or more DC contactors. Observing the TRU for the second predetermined amount of time can include observing the one or more DC contactors during the second predetermined amount of time, wherein determining that the TRU backfeed protection is functional and passes the test includes determining the TRU backfeed protection passes the test if the TRU contactor and the one or more DC contactors are all open during the second span of time, and wherein determining that the TRU backfeed protection has failed the text includes determining the TRU backfeed protection has failed the test if any of the TRU contactor and the one or more DC contactors do not open during the second span of time.

The method can include checking for a protective trip status after removing the AC power supplied to the TRU before continuing with the test. It is also contemplated that the method can include fault isolation of the TRU, the TRU contactor, and/or other contactor or contactors if the TRU backfeed protection fails the test.

A system includes a transformer rectifier unit (TRU) including a backfeed sense module. A TRU contactor is operatively connected to the TRU for selectively supplying DC power to a DC bus from the TRU with the TRU contactor closed and isolating the DC bus from the TRU with the TRU contactor opened. A contactor driver is operatively connected to an interlock relay to receive a signal from the backfeed sense module and to control opening and closing of the TRU contactor based on the signal. The contactor driver is configured to open the TRU contactor upon receipt of the signal indicative of backfeed detected in the TRU. A controller is operatively connected to the TRU and has machine readable instructions configured to cause the controller to perform a test a test as described above on the backfeed protection function of the contactor driver.

The TRU can be a first TRU, wherein the contactor is a first TRU contactor. The system can include a first AC bus configured to supply power from a first AC power source. A second AC bus can be configured to supply power from a second AC power source. The first TRU can connect a first DC bus to the first AC bus through the first TRU contactor. A second TRU can connect a second DC bus to the second AC bus through a second TRU contactor. A first DC essential bus can be connect to the first DC bus through a first essential contactor. A second DC essential bus can be connected to the second DC bus through a second essential contactor. An essential TRU can be connected to a third DC essential bus through an essential TRU contactor. A first essential tie contactor (ETC) can selectively connect between the first DC essential bus and the third DC essential bus. A second ETC can selectively connect between the third DC essential bus and the second DC essential bus. An AC essential bus tie contactor (AETC) can selectively connect between an AC essential bus and the first and second AC busses. A ram air turbine (RAT) line contactor can connect between the AETC and the AC essential bus to selectively connect a RAT to the AC essential bus.

The controller can be a generator control unit (GCU) operatively connected to control one or more generators operatively connected to supply AC power to the first and/or second AC busses, and/or a bus power control unit (BPCU) operatively connected to control one or more of the contactors. The controller can be operatively connected to perform the test for backfeed protection in both the first TRU and the second TRU.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein.

DETAILED DESCRIPTION OF THE PREFERRED EMBODIMENTS

Figure 1:
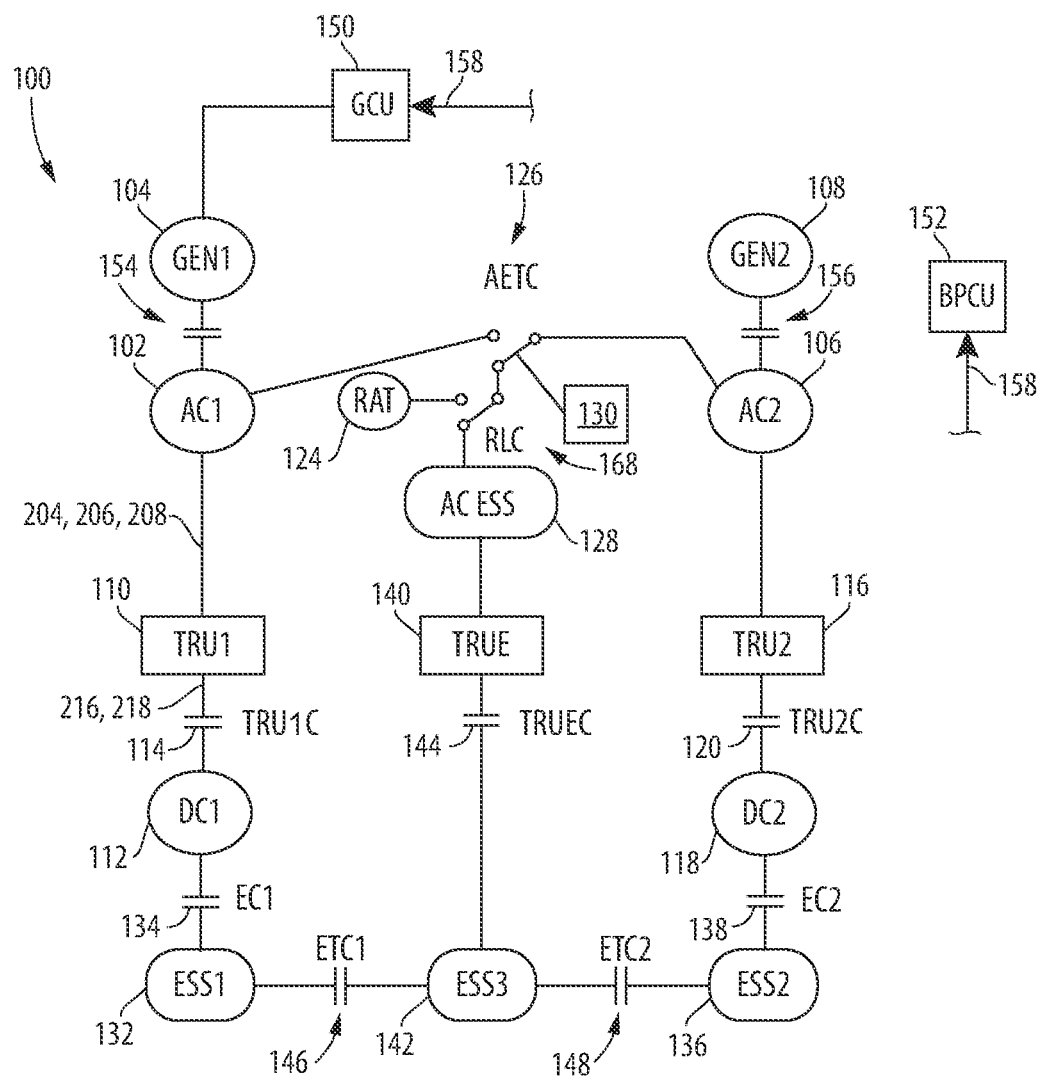
FIG. 1 is a schematic view of an embodiment of a system constructed in accordance with the present disclosure, showing the AC and DC busses and the contactors interconnecting the same.

Reference will now be made to the drawings wherein like reference numerals identify similar structural features or aspects of the subject disclosure. For purposes of explanation and illustration, and not limitation, a partial view of an embodiment of a system in accordance with the disclosure is shown in FIG. 1 and is designated generally by reference character 100. Other embodiments of systems in accordance with the disclosure, or aspects thereof, are provided in FIGS. 2-3, as will be described. The systems and methods described herein can be used to do built in testing of transformer rectifier unit (TRU) backfeed interlock functionality.

The system 100 includes a first AC bus 102 configured to supply power from a first AC power source, e.g. generator 104. A second AC bus 106 is configured to supply power from a second AC power source, e.g. generator 108. A first transformer rectifier unit (TRU) 110 connects a first DC bus 112 to the first AC bus 102 through a first TRU contactor (TRUC) 114. A second TRU 116 connects a second DC bus 118 to the second AC bus 106 through a second TRUC 120.

An AC essential bus tie contactor (AETC) 126 can selectively connect between an AC essential bus 128 and the first and second AC busses 102, 106. An AETC controller 130 is connected to switch the AETC 126 between a first state connecting the AC essential bus 128 to the first AC bus 102 and a second state connecting the AC essential bus 128 to the second AC bus 106. A first DC essential bus 132 is connected to the first DC bus 112 through a first essential contactor (EC) 134. A second DC essential bus 136 is connected to the second DC bus 118 through a second EC 138. An essential TRU 140 can be connected to a third DC essential bus 142 through an essential TRUC 144.

A first essential tie contactor (ETC) 146 can selectively connect between the first DC essential bus 132 and the third DC essential bus 142. A second ETC 148 can selectively connect between the third DC essential bus 142 and the second DC essential bus 136. A ram air turbine (RAT) line contactor 168 connects between the AETC 126 and the AC essential bus 128 to selectively connect a RAT 124 to the AC essential bus 128. The AC and DC essential busses 128, 132, 136, and 142 can potentially be powered even if only one of the generators 104, 108 or RAT 124 is available, by controlling the various contactors.

Figure 2:
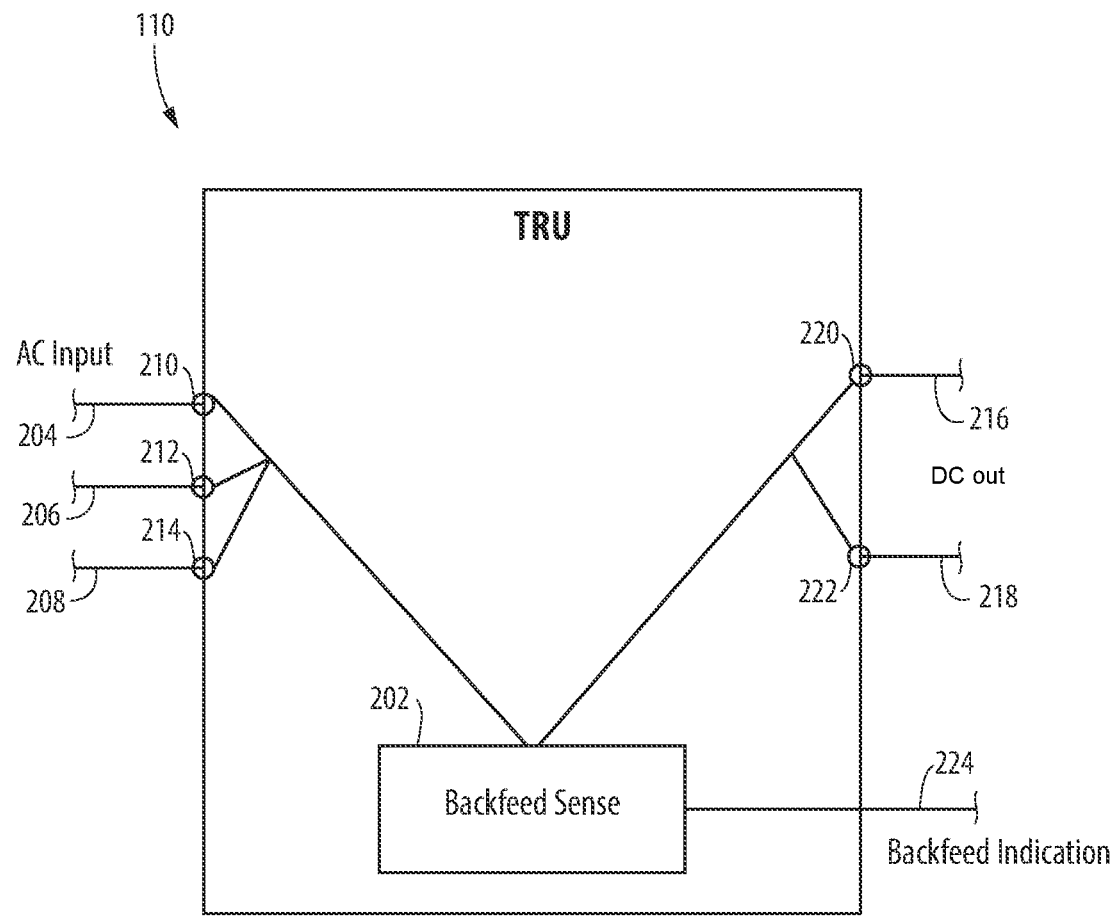
FIG. 2 is a schematic view of one of the transformer rectifier units (TRU) of FIG. 1, showing the backfeed sense module.

With reference now to FIG. 2, one of the TRUs namely TRU 110, is shown. However those skilled in the art will readily appreciate that any or all of the TRUs 110, 116, 140 can include the same components as described herein with reference to TRU 110. The TRU 110 includes a backfeed sense module 202. The TRU 110 includes a first AC input line 204, a second AC input line 206, and a third AC input line 208 all operatively connected to supply AC power from an AC bus (e.g. AC bus 102 of FIG. 1) to the TRU 110. The backfeed sense module 202 includes a respective sensor 210, 212, 214, each operatively connected to the first AC input line 204, second AC input line 206, and third AC input line 208.

The TRU includes a first DC output line 216 and a second DC output line 218 both operatively connected to supply DC power to a DC bus, e.g. DC bus 112 of FIG. 1, from the TRU 110. The backfeed sense module 202 includes a respective sensor 220, 222, each operatively connected to the first DC output line 216 and the second DC output line 218. The sensor(s) 210, 212, 214, 220, 222 can be voltage sensors or any other suitable sensor type, e.g. current sensors, power sensors, or the like, for detecting voltage, current, and/or power in lines.

Figure 3:
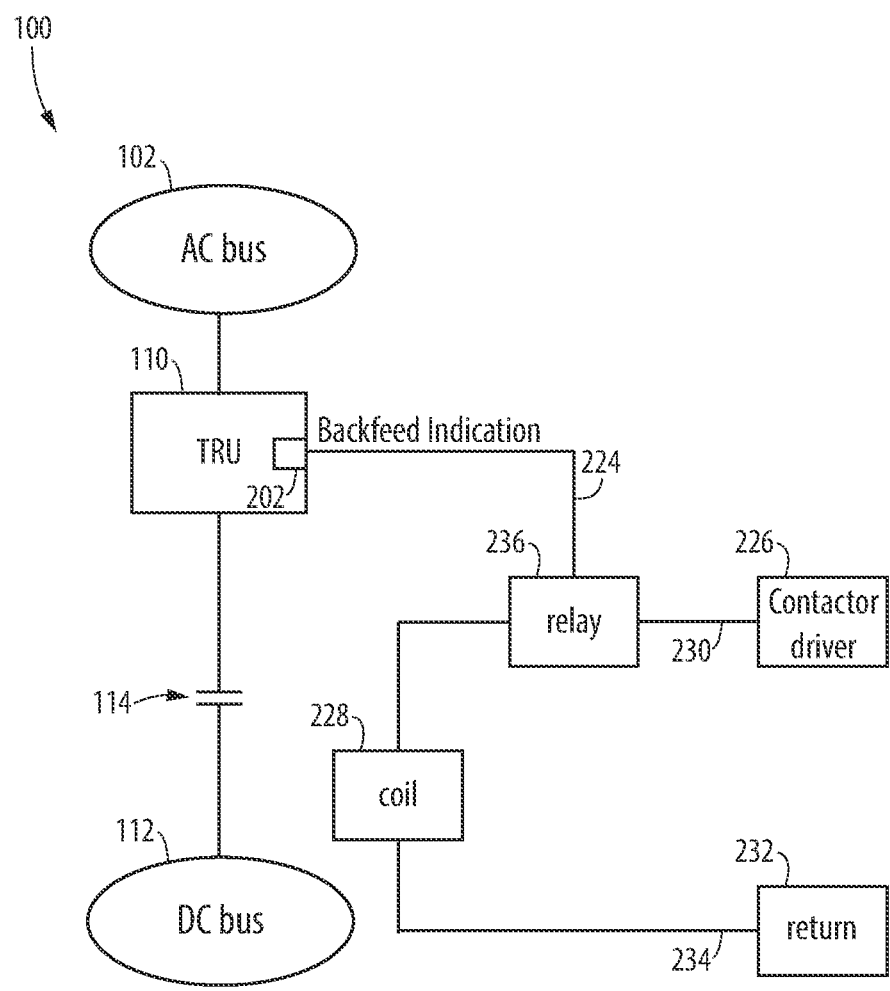
FIG. 3 is a schematic view of a portion of the system of FIG. 1, showing the contactor driver.

With reference now to FIG. 3, the backfeed sense module 202 is configured to produce and output a signal, e.g. in signal line 224 (also shown in FIG. 2), to a contactor driver 226 with information indicative of backfeed detected in the TRU 110. The contactor driver 226 is operatively connected to receive the signal from the backfeed sense module 202 and to control opening and closing of the contactor 114 based on the signal. The contactor driver 226 is configured to open the contactor 114 upon receipt of the signal indicative of backfeed detected in the TRU 110. The contactor driver 226 is configured to open the contactor 114 in the event of no AC voltage, current and/or power sensed in the first, second, and third AC inputs 210, 212, 214 (shown in FIG. 2) but wherein there is DC voltage, current and/or power sensed in the first and second DC inputs 220, 222 (shown in FIG. 2).

With continued reference to FIG. 3, the contactor driver 226 is operatively connected to control a coil 228, e.g. a solenoid coil of the contactor 114, through line 230. The coil 228 is operatively connected to a return 232 by line 234. A relay 236 in line 230 is operatively connected between the contactor driver 226 and the coil 228 to relay the signal from the backfeed sense module 202 and to power or depower the coil 228. It is also contemplated that the relay 236 can instead be operatively connected in line 234 between the coil 228 and the return 232. The relay 236, contactor driver 226, and coil 228 form a relay interlock for the contactor 114.

A method of distributing power includes powering a DC bus (e.g. DC bus 112, 118 of FIG. 1) with power from a TRU (e.g. TRU 110, 140, 116 of FIG. 1) thorough a contactor (e.g. contactor 114, 120, 144 of FIG. 1) and detecting backfeed in the TRU. The method includes opening the contactor to disconnect the DC bus from the TRU in response to detecting the backfeed in the TRU. Detecting backfeed in the TRU includes monitoring one or more AC input lines (e.g. AC input lines 204, 206, 208 of FIG. 2) to the TRU and monitoring one or more DC output lines (e.g. DC output lines 216, 218 of FIG. 2) from the TRU. The method includes determining there is backfeed in the TRU if there is voltage, current and/or power detected in the DC output lines but no voltage, current and/or power detected at the AC input lines. The backfeed sense module 202 and/or contactor driver 226 can include machine readable instructions configured to carry out the methods disclosed herein, which can include analog, digital, and/or electronic circuit implemented machine readable instructions.

With reference again to FIG. 1, an operational built in test can verify functionality of the TRU backfeed protection interlock or module as a part of a normal aircraft power cycle. The methodology is as described below. The controller handling the built in test can be a generator control unit (GCU 150) operatively connected to control one or more generators 104, 108, which in turn are operatively connected to supply AC power to the AC busses 102, 106, (only one GCU 150 is depicted in FIG. 1, however each generator 104, 108 can have its own GCU). The methodology can also be implemented with a controller that is a bus power control unit (BPCU 152) operatively connected to control one or more of the contactors 114, 120, 126, 134, 138, 144, 146, 148 (for sake of clarity, not all of the contactor connections to the BCPU 152 are shown in FIG. 1). The controller can be operatively connected to perform the test for backfeed protection in one or more of the TRU's 110, 140, 116.

The TRU contactor controller recognizes or confirms that the aircraft (with system 100 on board) is in ground mode, not in flight, and that the functional test is permitted to be performed. Inputs such as weight on wheels and airspeed can be used for this test. Additional inputs such as external power or auxiliary power unit (APU) source only status may be used if desired. These inputs are represented by reference character 158 in FIG. 1.

The controllers (e.g. GCU 150) then removes all AC power sources, such as generators 104, 108, from the TRU(s) 110, 116, 140 being tested, for example by opening the generator contactors 154 and 156 which selectively connect the generators 104, 108 to their respective AC busses 102, 106. Removing the AC power sources can also include having the RLC 168 to the position shown in FIG. 1.

When last AC power source is removed, and there are no faults in the system detected causing a protective trip status to be indicated, the main controller (e.g. GCU 150 or BPCU 152) commands the TRU contactor controller, i.e. contactor driver 226 of FIG. 3, to keep the TRU contactor 114, 120, or 144 commanded closed for a set amount of time, e.g. X seconds, after AC input power is removed. This may also involve commanding any downstream DC contactors, e.g. contactors 134, 138, 146, 148, to be closed as well. With the AC power source offline, but the TRU 110, 140, 116 and any downstream DC contactors closed, this will backfeed the TRU 110, 140, 116 with power from the battery. For example, closing TRUC1 114 and EC1 134 connects TRU1 110 to backfeed from battery power connected to ESS1 132 to test the backfeed protection on TRU1 110.

The controller (GCU 158 or BPCU 152) then waits Y seconds and observes the TRU 110, 140, 116 being tested and other downstream DC contactor(s) commanded closed. The amount of time Y is less than X, but greater than the time needed for the backfeed protection and interlock to work. For example in a given system, if the backfeed protection interlock function takes 1 second to operate, X could be 5 seconds and Y could be 2 seconds during the 5 seconds of X.

If, during the time Y the contactor under test, e.g. contactor 114 if testing TRU1 110, is open as intended by the interlock, the controller (GCU 150 or BPCU 152) can determine that the backfeed protection interlock for the TRU being tested is functional. If, on the other hand, the contactor did not open, the controller can determine that the backfeed protection interlock for the TRU being tested has failed. Contactor, TRU, interlock relay, and other status can be used to determine where the failure has occurred, i.e. for fault isolation. This test can be repeated for all of the TRU's 114, 120, 144.

At this stage, the controller (GCU 150 or BPCU 152) can remove the TRU contactor command, e.g. allow all relevant contactors to open as normal, and end the test. The controller can then communicate test results or any fault messages if applicable. For example, the controller can output and alert or maintenance message(s), including indication of dormancy of TRU backfeed protection or the like for further action by personnel or automated service systems.

Systems and methods as disclosed herein provide for a test on the backfeed protection function or module (described above with reference to FIGS. 2-3) of the contactor drivers. Those skilled in the art will readily appreciate that each TRU being tested can use a different controller to perform the test (e.g. if the test is being run in a GCU or BPCU, each TRU can be tested by its own GCU/BPCU). Those skilled in the art having had the benefit of this disclosure will readily appreciate the potential benefit of precluding dormancy of potentially safety critical interlock function which can remove the need for an AC relay (which is an important advantage in applications that may not have room for the AC relay).

As will be appreciated by those skilled in the art, aspects of the present disclosure may be embodied as a system, method or computer program product. Accordingly, aspects of this disclosure may take the form of an entirely hardware embodiment, an entirely software embodiment (including firmware, resident software, micro-code, etc.), or an embodiment combining software and hardware aspects, all possibilities of which can be referred to herein as a "circuit," "module," or "system." A "circuit," "module," or "system" can include one or more portions of one or more separate physical hardware and/or software components that can together perform the disclosed function of the "circuit," "module," or "system", or a "circuit," "module," or "system" can be a single self-contained unit (e.g., of hardware and/or software). Furthermore, aspects of this disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of this disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of this disclosure may be described above with reference to flowchart illustrations and/or block diagrams of methods, apparatus (systems) and computer program products according to embodiments of this disclosure. It will be understood that each block of any flowchart illustrations and/or block diagrams, and combinations of blocks in any flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in any flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified herein.

The methods and systems of the present disclosure, as described above and shown in the drawings, provide for built in testing of TRU backfeed interlock functionality. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. A method for performing a test for transformer rectifier unit (TRU) backfeed protection comprising:
   opening at least one generator contactor connecting AC power to the TRU to remove the AC power supplied to the TRU;
   maintaining a TRU contactor in a closed state for a first predetermined span of time after removal of the AC power;
   observing the TRU contactor for a second predetermined span of time;
   determining, if the TRU contactor opens during the second predetermined span of time, that the TRU backfeed protection is functional and passes the test; and
   determining, if the TRU contactor does not open during the second predetermined span of time, that the TRU backfeed protection has failed the test.

2. The method as recited in claim 1, further comprising ceasing maintaining the TRU contactor in the closed state to end the test.

3. The method as recited in claim 1, further comprising communicating whether the TRU passed or failed.

4. The method as recited in claim 1, wherein opening the at least one generator contactor to remove the AC power supplied to the TRU is performed as part of a normal cycle of a power system of an aircraft in which the TRU is located.

5. The method as recited in claim 1, further comprising confirming an aircraft on which the TRU is located is not in flight to ensure the test is not performed in flight.

6. The method as recited in claim 5, wherein confirming the aircraft is not in flight includes receiving input including weight on wheels, airspeed, external power supplied to the aircraft, and/or status of an auxiliary power unit (APU) aboard the aircraft to confirm whether the aircraft is in flight.

7. The method as recited in claim 1, wherein maintaining the TRU contactor in the closed state for the first predetermined span of time includes:
maintaining one or more DC contactors in series with the TRU contactor in the closed state during the first predetermined span of time.

8. The method as recited in claim 7, further comprising backfeeding the TRU with power from a battery connected to the TRU through the one or more DC contactors.

9. The method as recited in claim 8, wherein;
observing the TRU contactor for the second predetermined span of time includes observing the one or more DC contactors during the second predetermined span of time;
determining that the TRU backfeed protection is functional and passes the test includes determining the TRU backfeed protection passes the test if the TRU contactor and the one or more DC contactors are all open during the second predetermined span of time; and
determining that the TRU backfeed protection has failed the test includes determining the TRU backfeed protection has failed the test if any of the TRU contactor and the one or more DC contactors do not open during the second predetermined span of time.

10. The method as recited in claim 9, further comprising fault isolating the TRU, the TRU contactor, and/or another contactor or contactors if the TRU backfeed protection fails the test.

11. The method as recited in claim 1, further comprising fault isolating the TRU, the TRU contactor, and/or another contactor or contactors if the TRU backfeed protection fails the test.

12. The method as recited in claim 1, further comprising checking for a protective trip status after removing the AC power supplied to the TRU before continuing with the test.

13. A system comprising:
a transformer rectifier unit (TRU) including a backfeed sense module;
a TRU contactor operatively connected to the TRU and configured to selectively supply DC power to a DC bus from the TRU with the TRU contactor closed and isolate the DC bus from the TRU with the TRU contactor opened;
a relay configured to receive a signal from the backfeed sense module;
a contactor driver operatively connected to the relay and configured to control opening and closing of the TRU contactor based on the signal received by the relay, wherein the contactor driver is configured to open the TRU contactor upon receipt of the signal indicative of backfeed detected in the TRU; and
a controller operatively connected to the TRU and having machine readable instructions configured to cause the controller to perform a test for TRU backfeed protection, wherein the machine readable instructions configured to cause the controller to perform the test comprise machine readable instructions configured to cause the controller to:
open at least one generator contactor connecting AC power to the TRU to remove the AC power supplied to the TRU;
maintain the TRU contactor in a closed state for a first predetermined span of time after removal of the AC power;
observe the TRU contactor for a second predetermined span of time;
determine, if the TRU contactor opens during the second predetermined span of time, that the TRU backfeed protection is functional and passes the test; and
determine, if the TRU contactor does not open during the second predetermined span of time, that the TRU backfeed protection has failed the test.

14. The system as recited in claim 13, wherein the TRU is a first TRU, wherein the TRU contactor is a first TRU contactor, and further comprising:
a first AC bus configured to supply power from a first AC power source, the first TRU connecting a first DC bus to the first AC bus through the first TRU contactor;
a second AC bus configured to supply power from a second AC power source;
a second TRU connecting a second DC bus to the second AC bus through a second TRU contactor;
a first DC essential bus connected to the first DC bus through a first essential contactor;
a second DC essential bus connected to the second DC bus through a second essential contactor;
an essential TRU connected to a third DC essential bus through an essential TRU contactor;
a first essential tie contactor (ETC) selectively connecting between the first DC essential bus and the third DC essential bus;
a second ETC selectively connecting between the third DC essential bus and the second DC essential bus;
an AC essential bus tie contactor (AETC) selectively connecting between an AC essential bus and the first and second AC busses; and
a ram air turbine (RAT) line contactor connecting between the AETC and the AC essential bus to selectively connect a RAT to the AC essential bus.

15. The system as recited in claim 14, wherein the controller is a generator control unit (GCU) operatively connected to control one or more generators operatively connected to supply AC power to at least one of the first and second AC busses, and wherein the GCU is operatively connected to perform the test for backfeed protection in both the first TRU and the second TRU.

16. The system as recited in claim 14, wherein the controller is a bus power control unit (BPCU) operatively connected to control one or more of the contactors, and wherein the BPCU is operatively connected to perform the test for backfeed protection in both the first TRU and the second TRU.

17. The system as recited in claim 13, wherein the TRU contactor comprises a solenoid coil, and wherein the solenoid coil is powered and depowered responsive to the signal from the backfeed sense module provided to the relay.

* * * * *